US008062068B2

(12) United States Patent
Sidiki et al.

(10) Patent No.: US 8,062,068 B2
(45) Date of Patent: Nov. 22, 2011

(54) ESD PROTECTION

(75) Inventors: Tamim Peter Sidiki, Heinsberg (DE); Horst Roehm, Hamburg (DE); Hans-Martin Ritter, Nahe (DE); Robert Muir Gemmel Izat, San Jose, CA (US); Rob P. Weber, Round Rock, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/663,822

(22) PCT Filed: Jun. 10, 2008

(86) PCT No.: PCT/IB2008/052291
§ 371 (c)(1), (2), (4) Date: May 25, 2010

(87) PCT Pub. No.: WO2008/152584
PCT Pub. Date: Dec. 18, 2008

(65) Prior Publication Data
US 2010/0248547 A1    Sep. 30, 2010

(30) Foreign Application Priority Data

Jun. 12, 2007    (EP) .................................. 07110071

(51) Int. Cl.
*H01R 13/66*    (2006.01)

(52) U.S. Cl. .................................................. 439/620.08
(58) Field of Classification Search ............. 439/620.08, 439/620.22–620.25
See application file for complete search history.

(56) References Cited

U.S. PATENT DOCUMENTS

| 5,147,223    | A     | 9/1992 | Black et al. |
| 6,203,334    | B1    | 3/2001 | Daoud et al. |
| 6,350,152    | B1 *  | 2/2002 | Belopolsky et al. ....... 439/541.5 |
| 6,881,096    | B2 *  | 4/2005 | Brown et al. ............ 439/620.01 |
| 2005/0197012 | A1 *  | 9/2005 | Ferentz ........................ 439/620 |
| 2007/0077816 | A1    | 4/2007 | Wan et al. |

FOREIGN PATENT DOCUMENTS

| EP | 1111730 A2 | 6/2001 |
| WO | 00/46883 A | 8/2000 |

\* cited by examiner

*Primary Examiner* — Ross Gushi (57) ABSTRACT

The present invention relates to an electrical connector for a first IC, comprising a second IC (12) carrying ESD protection, the second IC (12) being integrated into the connector (8), which enhances the ESD protection and preserves the RF performance of such connector (8). The present invention further relates to a method for making an electrical connector (8) for a first IC, comprising this step of providing ESD protection to the first IC by integrating a second IC (12) carrying ESD-protection into the connector (8).

19 Claims, 7 Drawing Sheets

ESD PROTECTION

FIELD OF THE INVENTION

The present invention relates to an electrical connector for a first integrated circuit. The present invention further relates to a method for making an electrical connector for a first integrated circuit.

BACKGROUND OF THE INVENTION

Electrical connectors provide an access to electrical and electronic circuits, e.g. integrated circuits, connected downstream to a power or signal path. However, in case of connecting two or more electronic devices considerable electrical potential differences or voltages may occur between the individual devices and, in case of electrical potential-free connections, electrostatic charges can be applied and when the associated electrical connectors are joint together, undesired discharge of the charges producing the potential difference, or electrostatic discharge of the electrostatic charge may occur. These discharging processes are apt to cause severe damage in a electronic equipment, e.g. an integrated circuit, arranged downstream the signal or power path, it being possible for the damage even to lead to complete failure of the respective equipment.

With process shrinks of the digital core in state of the art integrated circuits easing deep submicron technology much lower than 90 nm feature size, electrostatic discharge (ESD) becomes very severe.

A number of prior art ESD protections are known, including usually both the design of ESD-circuits as part of the integrated circuit on the motherboard and also the provision of separate discrete or semi-discrete components for ESD protection to be placed on the motherboard. Such semi-discrete components include products with a plurality of diodes and RC-filters and are particularly intended for portable applications. Also, U.S. Pat. No. 5,147,223 and EP 1111730 A2 show prior art ESD protection. U.S. Pat. No. 5,147,223 shows a Zener diode for purposes of ESD protection of an electrical connector. EP 1111730 A2 shows an additional electrically conductive material to discharge charges from an electrical connector.

SUMMARY OF THE INVENTION

It is an object of the present invention to provide enhanced ESD for electrical connectors.

In a first aspect of the present invention it is presented an electrical connector for a first IC, the connector comprising a second IC carrying ESD protection, the second IC being integrated into the connector.

In a further aspect of the present invention it is presented a ESD protection assembly suitable for integration into a connector for a first IC, the assembly comprising a carrier-PCB being connectable to pins of a dedicated connector of the first IC, and a second IC carrying ESD protection, the second IC being located on the carrier-PCB.

In a further aspect of the present invention it is presented a method for making an electrical connector for a first IC, the method comprising the step of providing ESD protection to the first IC by integrating a second IC carrying ESD-protection into the connector.

In even further aspects of the present invention presented are a PCB comprising the afore-mentioned electrical connector, as well an electronic device.

The term 'RF' means in the context of the present application that the frequency at which the data signals are transmitted are in the RF range, e.g. at least 100 MHz. Particularly, the present invention addresses connectors for use at frequencies of at least 400 MHz, and more particularly connectors for use in accordance with the Universal Serial Bus (USB) 2.0, 3.0 and further versions. USB 2.0 uses for instance 450 MHz, USB 3.0 uses 3.0 GHz.

The terms 'high speed' or "high data rate" mean in the context of the present application that the frequency at which the data signals are transmitted are in the RF range.

In the context of this application the term "connector" or "electrical connector" can be anything which reminds of a connector, i.e., can be a standard USB connector, e.g. an USB connector according to the respective technical international standard for USB connectors, a mini-USB, a Display Port, a High Definition Multimedia Interface (HDMI), an Instrument Neutral Distributed Interface (INDI) and or any other interface.

The term "standard IC package" means in the context of the present application that the IC package is a leadframe-based IC package.

The term "protective material" means in the context of the present application that the so-called material is enshrouding and/or protecting the object to which it is applied against electrical or mechanical impacts. Such "protective material" can for example comprise a layer of electrically insulating material, such as a globtop material.

The ESD protection of the present invention preferably is a system level protection. Such protections are preferably provided at the input of the system, so as to protect the system against damage or breakdown due to electrostatic discharge during use. It is particularly used in portable equipment such as mobile phones, portable computers etc, for at least one of following reasons: first, there are very many user interfaces, which increases the risk of an ESD event. Secondly, a portable apparatus may be used even under harsh conditions, such as in a desert or when it is freezing. Thirdly, the electronic system is often located very near to the user interface. In view thereof, protections up to 15 kV, preferably at least for 1000 strikes, as measured in accordance with Human Base Model as known to the skilled person, are prescribed.

Such an ESD protection cannot be integrated appropriately within the first integrated circuit, particularly integrated circuits of advanced technology such as 90 nm and beyond. Instead, use is made of discrete or semi-discrete components, the latter usually comprising a combination of a number of active elements, e.g. diodes, and passive elements, for filtering purposes.

The present invention comprises the perception that it is an inherent problem in the design of these system level ESD protections that their protecting character may not hamper the signal transmission, which is generally large at system inputs. This high level of signal transmission particularly occurs where a wired bus connection is present as a system input. An example is the aforementioned USB bus. In view of the needed speed of such bus connection, the frequency of the connection is increased. Hence, the system level ESD protection must be designed in a manner so as not to hamper the signal transmission at RF frequencies. Here, matters start to become really complex, since at RF frequencies the impedance of any interconnect or other element has to be taken into account in order to maintain a proper signal to noise ratio. Moreover, undesired signal interaction may occur at a harmonic frequency of the frequency in use.

It is now the insight of the invention that both the ESD protection properties and the RF properties of a system level ESD protection based on one or more semidiscrete components—i.e. the second IC—may preferably be optimized by integrating the components into the connector in a manner such that the system level protection is coupled directly between an input pin and a ground pin of the connector.

While an addition of a Zener diode for ESD protection is known from the above-mentioned prior art of U.S. Pat. No. 5,147,223, it is not clear that such measure leads to an adequate system level protection with the required RF properties. The design of a connector has a low resolution in comparison to the dimensions used in semiconductor industry. Additionally, connectors contain metal parts, which evidently lead to parasitic interactions at RF frequencies. To avoid such parasitic interactions it appears thus a more logical choice for the skilled person to put the vital ESD protection outside the connector, in an area with a resolution comparable to that of the components used in the ESD protection, and near to the components to be protected.

According to embodiments of the present invention, the semi-discrete ESD protection components are integrated into a connector. This can be but is not exclusively a USB connector. Having the ESD protection right at the entrance port of the main PCB not only enhances the protection of the first IC or the main PCB or mother board, but also preserves the RF performance of such preferably silicon equipped connectors.

Due to the position of the ESD protection nearer to the external pins of the first IC within the connector a better RF performance can be reached. Moreover, by integrating the ESD protection into the connector, there are other boundary conditions and the effects of the mother board layout need not to be taken into account. The ESD protection performance can be optimized independently from the motherboard. Furthermore this simplifies the design of the mother board and improves the performance of the first IC.

Preferred embodiments of the invention are defined in the dependent claims.

A preferred embodiment discloses a connector wherein the second IC is coupled between pins of the connector. This is a location for the second IC very near to the external contacts of the first IC and easy to implement.

In a particular embodiment, the present invention overcomes the problems of the prior art in that the second IC or the ESD protection assembly is attached to or in a carrier, preferably a carrier-PCB, having holes or apertures, such that the pins of the connector can be both mechanically and electrically connected to the carrier. The carrier operates as an intermediate between the resolution of that of the second IC and that of the pins. Moreover, it allows the definition of interconnects in a manner so as to tune the RF properties of the ESD protection. For instance, the internal resistance of the interconnects may be reduced by provision of a ground plane in or on the bottom of the carrier. As a result, the interconnects function as microstrips, transmission lines, etc.

A preferred embodiment discloses a connector wherein the second IC is located on a discrete or separate carrier-PCB. The second IC having its own discrete or separate carrier-PCB makes handling of such second IC easy. Although referred herein as a carrier-PCB, it is not excluded that this carrier-PCB comprises a ceramic material. Such ceramic carriers are based on alumina or are otherwise multilayered carriers made in LTCC (Low Temperature Cofired Ceramics)-technology. In a specific modification hereof, the second IC is already provided in a standard IC package that is assembled to the carrier-PCB. Alternatively, the second IC may be provided on the carrier-PCB directly, with either a flip-chip or a wirebonded connection. Such wirebonds are thereafter suitably covered with a layer of electrically insulating material, such as a globtop material.

Alternatively, clips or other metal connectors may be used for the connection between the second IC and the carrier-PCB. In case of the use of a flip-chip connection, the second IC is preferably provided with an underbump metallization on top of the passivation layer of the second IC, and with solder bumps thereon. Optionally, an additional stress-release layer is provided on top of the passivation layer, such as commercially available from FlipChip International.

An alternative embodiment discloses a connector wherein the second IC is located at least partly within the carrier, such as a carrier-PCB. Assembly techniques for assembling the second IC within a carrier are currently studied. They appear very advantageous for the present type of semi-discrete components, in view of miniaturization and in order to minimize transitions between different interconnects. Particularly, package leads can be left out.

A preferred embodiment discloses a connector wherein the carrier-PCB is connected to the pins at a first location on the pins which first location is spaced by a certain distance, preferably about 0.1-1.0 mm, more preferably about 0.5 mm, from a second location which second location is designated to be connected to a mother board for the first IC. This is considered to be an optimum position for ESD protection purposes.

A preferred embodiment discloses a connector or an ESD protection assembly wherein the carrier-PCB comprises holes adapted to receive the pins of the dedicated connector. Accordingly, the pins of the connector will more easy go through the holes in the carrier-PCB. This solution particularly enables integration of the ESD protection without modification of the connector.

A preferred embodiment discloses an ESD protection assembly, wherein the assembly is designed to provide at least between 8 and 15 kV ESD protection, preferably for at least 1000 ESD strikes. Accordingly, the very high requirements especially for computing and consumer products system level protection of up to 15 kV at least for 1000 strikes can be achieved.

A preferred embodiment discloses an ESD protection assembly wherein the assembly comprises an active silicon based IC (i.e. before referred to as second IC). This IC is particularly a semi-discrete component comprising a relatively small number of components in a resolution that is low in comparison to the resolution of advanced ICs. Particularly, the number of components such as transistors, diodes, resistors, capacitors is suitably less than fifty, and usually less than twenty.

A preferred embodiment discloses an ESD protection assembly wherein the aforementioned active silicon based IC comprises diodes in a rail-to-rail configuration. This provides better RF performance.

A preferred embodiment discloses an ESD protection assembly wherein the second IC shows a small internal capacitance, preferably less than 3 pF and preferably less than 1.5 pF. Such a small internal capacitance provides enhanced RF performance, as the magnitude of the internal capacitance poses a limit to the frequency of data transmission. An internal capacitance of a few pF or less allows transmitting of data at frequencies of 500 MHz.

A further preferred embodiment of the present invention discloses an ESD protection assembly, wherein the second IC is attached to the carrier-PCB and at least some of connections between the second IC and the carrier-PCB are protected by a protective material enshrouding the second IC and its connections to the carrier-PCB.

In the second IC of the invention, the internal capacitance has turned out to be due, at least partially, to parasitic coupling between bond pads and a conductive zone in the substrate. In order to minimize the internal capacitance, it is considered advantageous to provide a bond pad structure with an underbump metallization extending above a passivation layer and a bond pad, which is coupled to the underbump metallization in an aperture in the passivation layer, with a surface area that is reduced in comparison to the underbump metallization. One example hereof is a split of the bond pad into an inner area and a preferably ring-shaped area, which are connected merely locally. Such a bond pad structure has been found to withstand and dissipate stress due to forces during wirebonding or as a consequence of thermal cycling. It has been described in Applicant's non-prepublished European patent application EP 07104613.0 (PH007867). Another example is the limitation of the bond pad to the inner area only. The inner area should be understood as being just larger than the aperture in the passivation layer. This aperture in the passivation layer may have a diameter comparable to the thickness of the passivation layer. Preferably, it has a diameter which is less than fivefold the thickness of the passivation layer, and more preferably less than twice the thickness of the passivation layer.

A preferred embodiment discloses a method which performs the step of integrating by coupling the second IC between pins of the connector.

A preferred embodiment discloses a method which performs the step of coupling by placing the second IC on a carrier-PCB, and by connecting the carrier-PCB to the pins of the connector.

A preferred embodiment discloses a method further comprising the step of connecting the carrier-PCB to the connector prior to a step of connecting the connector to the first IC.

A preferred embodiment discloses a method further comprising the steps of assembling the second IC in a standard IC package, and connecting the standard IC package to the carrier-PCB.

A preferred embodiment discloses a method further comprising the steps of attaching the second IC to the carrier-PCB, and connecting input leads of the second IC to the carrier carrier-PCB by wire bonding.

A preferred embodiment discloses a method further comprising the steps of attaching the second IC to the carrier-PCB and connecting the input leads of the second IC to the carrier-PCB via wire bonding and protecting the second IC and the wire bonds by applying a protective material on top.

A preferred embodiment discloses a method further comprising the steps of flip-chipping the second IC to the carrier-PCB, thereby making contact between leads of the second IC and electrical traces of the carrier-PCB.

A preferred embodiment discloses a method further comprising the steps of attaching the second IC to the carrier-PCB, and protecting at least some of connections between the second IC and the carrier-PCB by enshrouding the second IC and its connections to the carrier-PCB with a protective material.

BRIEF DESCRIPTION OF THE DRAWINGS

These and other aspects of the invention will be apparent from and elucidated with reference to the embodiment(s) described hereinafter. In the following drawings

DETAILED DESCRIPTION OF THE INVENTION

The components in the drawings are not necessarily to scale, emphasize instead being placed upon clearly illustrating the principles of the present invention. Features that are substantially or functionally equal or similar will be referred to with the same reference sign(s).

Figure 1:
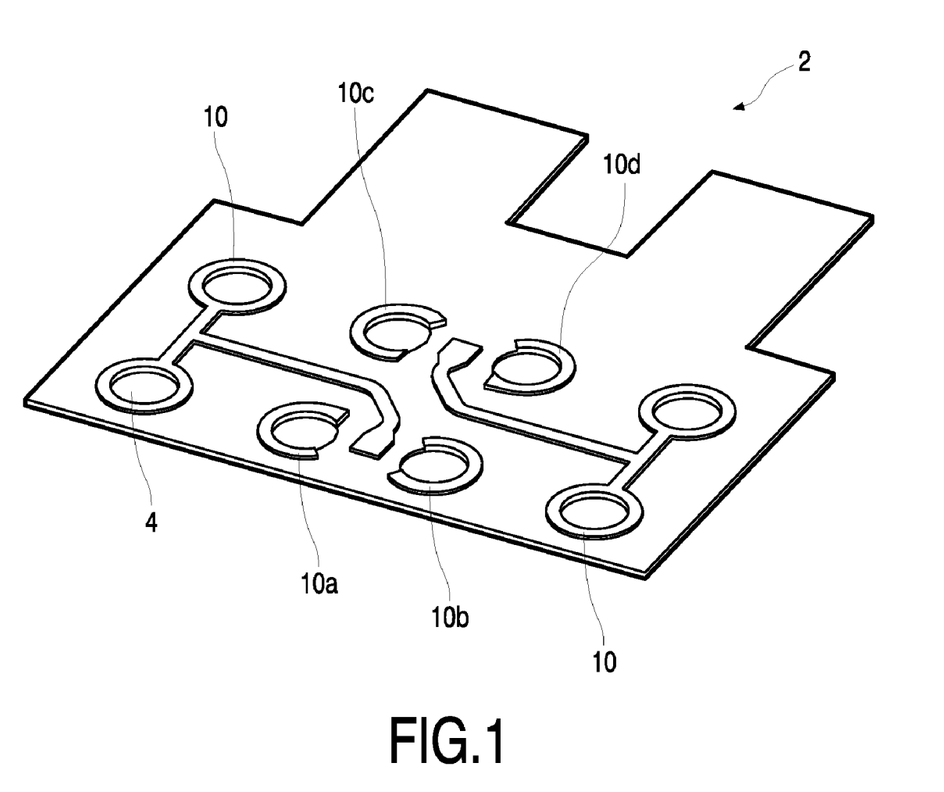
FIG. 1 shows a perspective view on a carrier-PCB of an embodiment of the present invention.
Figure 2:
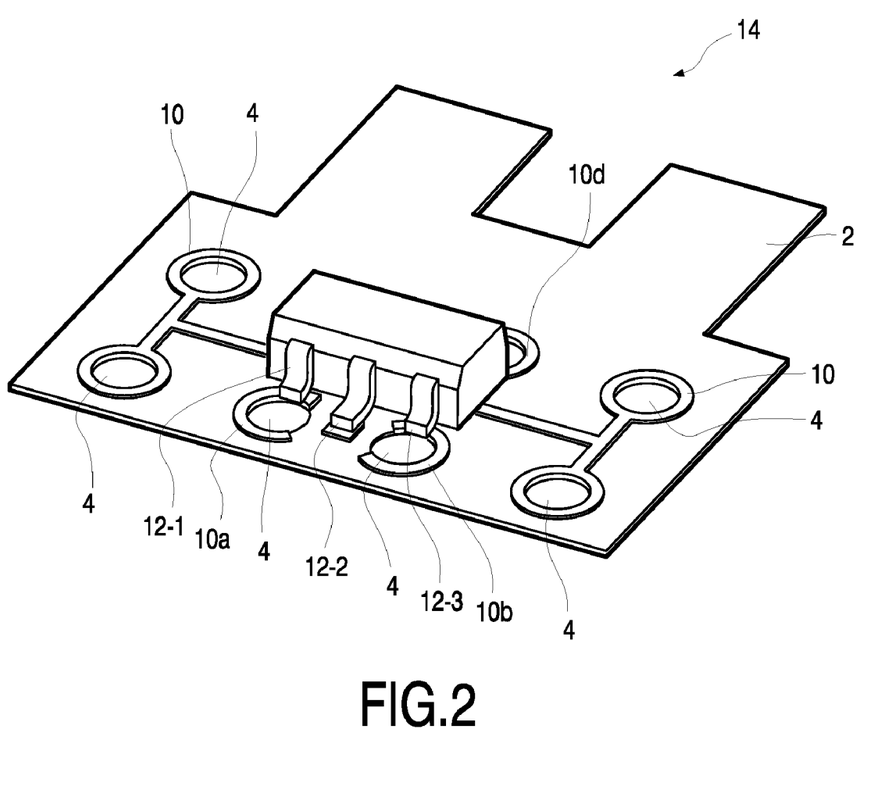
FIG. 2 shows a perspective view on the carrier-PCB of FIG. 1 with a second IC in place providing an ESD protection assembly.

FIG. 1 shows a perspective view on a carrier-PCB 2 of an embodiment of the present invention. Carrier-PCB 2 is a distinct and separate carrier-PCB. Carrier-PCB 2 comprises holes 4 adapted to receive pins 6 of a connector 8 as for example shown in FIGS. 6 and 7. Carrier-PCB 2 comprises electrical traces 10 for a second IC 12 as shown in FIG. 2. Four of the shown traces, i.e., the traces 10a, 10b, 10c and 10d are shortened to avoid and overlap with the holes 4.

Figure 6:
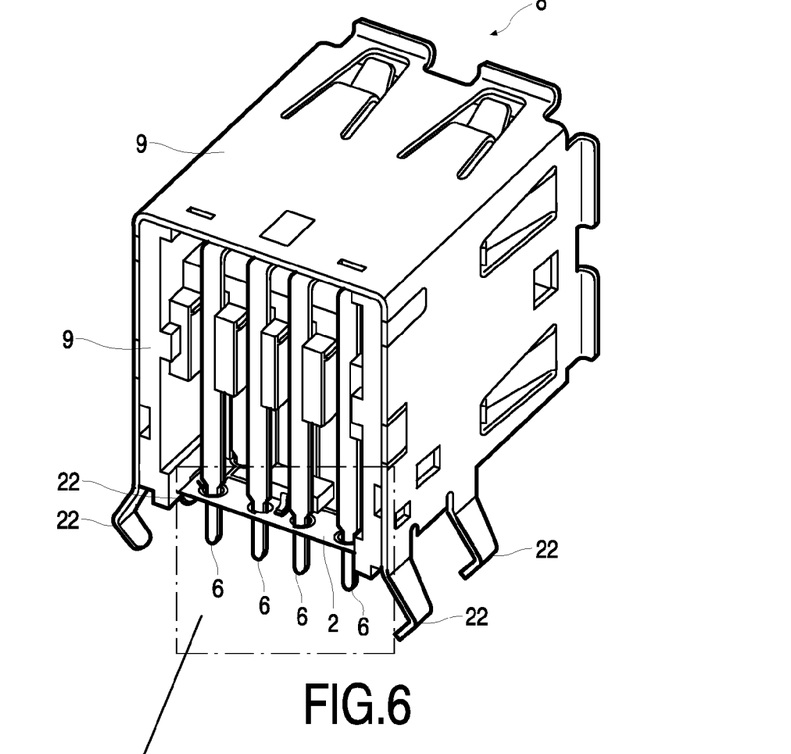
FIG. 6 shows a perspective view on the connector of FIG. 3 with the ESD protection assembly of FIG. 2 in place without the connector being placed on a mother board.
Figure 7:
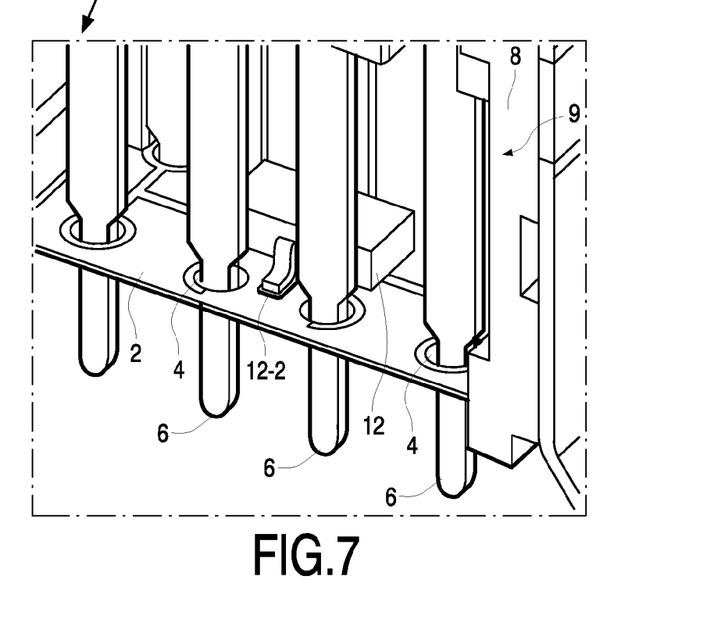
FIG. 7 shows an enlarged view on the encircled part of FIG. 6.

FIG. 2 shows a perspective view on the carrier-PCB 2 of FIG. 1 with a second IC 12 located on the carrier-PCB 2 providing ESD protection for an ESD protection assembly 14. ESD protection assembly 14 provides ESD protection for a not-shown first IC. Accordingly, carrier-PCB 2 can be connected to pins 6 of the dedicated connector 8 of the not-shown first IC as shown in FIGS. 6 and 7, for example. To make the second IC 12 suitable to be placed inside a footprint of the connector 8 the outer leads 12-1 and 12-3 of leads 12-1, 12-2, 12-3 of second IC 12 are trimmed short to 0.3 mm. In the same way the not-shown leads corresponding to leads 12-1, 12-2, 12-3 on the backside of IC 12 are trimmed correspondingly. This means that those leads at the positions 1, 3, 4, and 6 are trimmed short.

Second IC 12 is an active silicon based IC and comprises not shown diodes in a rail-to-rail configuration. The assembly 14 as shown in FIG. 2 is designed to provide at least between 8 and 15 kV ESD protection and shows a small internal capacitance in the order of 1 pF.

Figure 3:
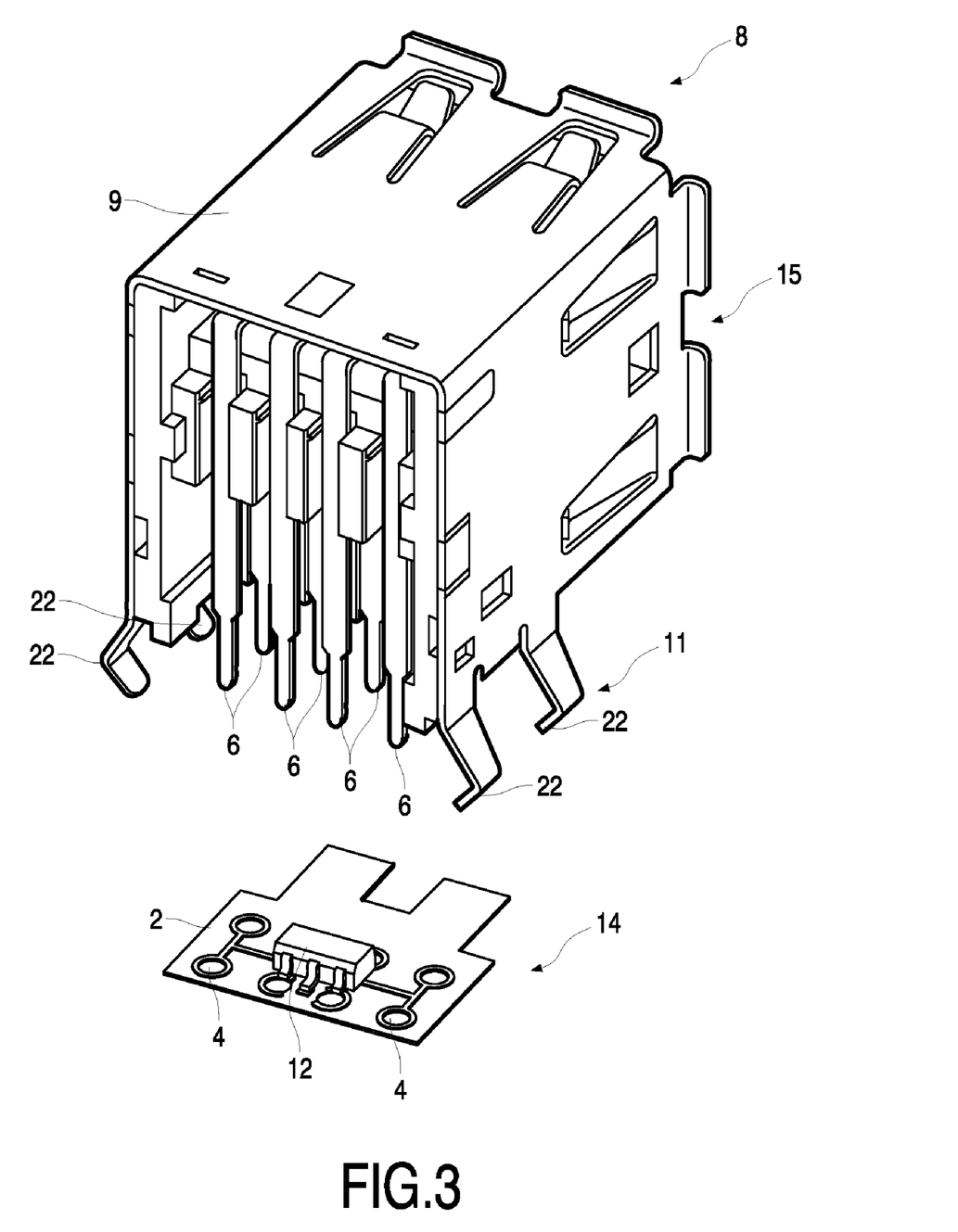
FIG. 3 shows an exploded perspective view on a connector together with the ESD protection assembly of FIG. 2.
Figure 4:
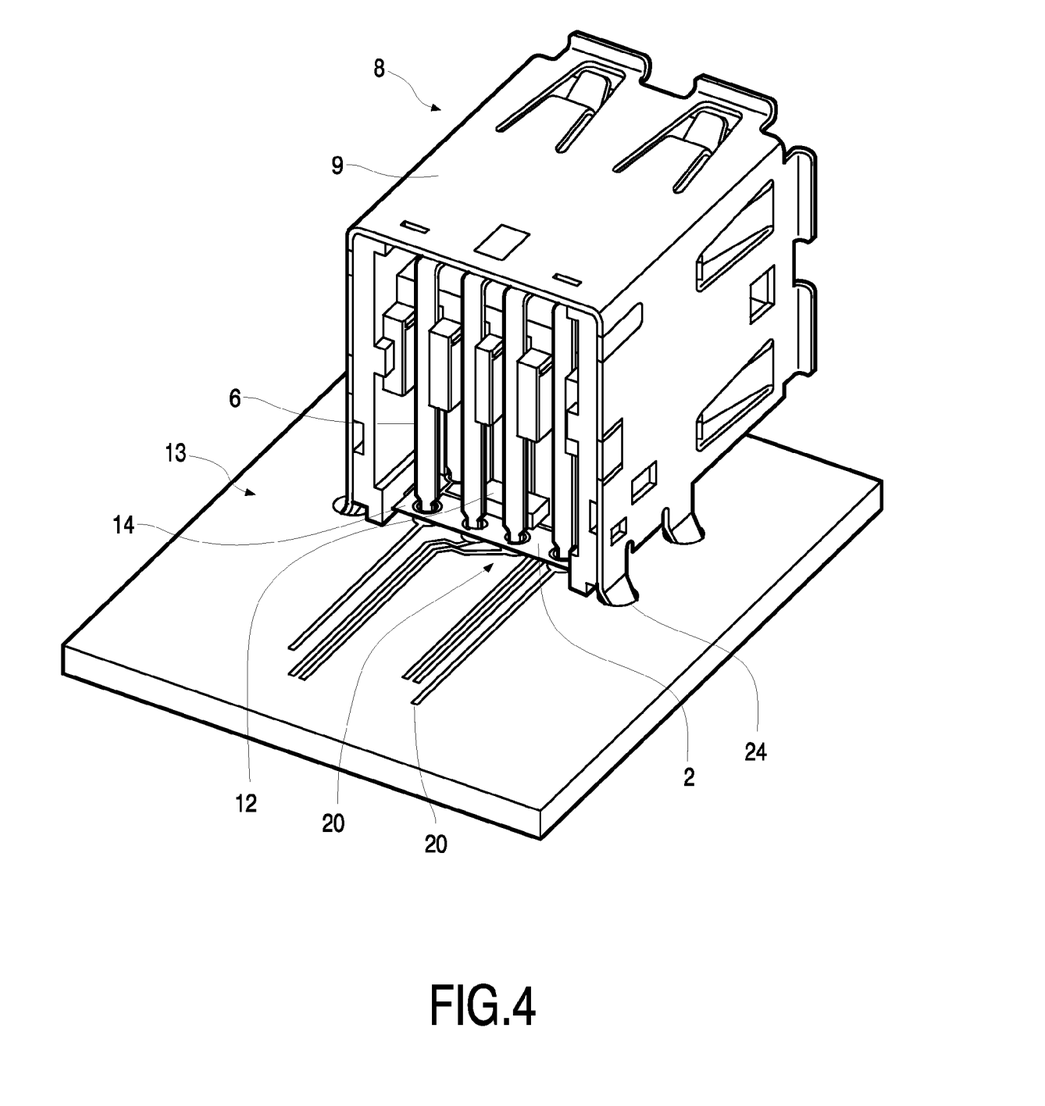
FIG. 4 shows a perspective view on the connector of FIG. 3 with the ESD protection assembly of FIG. 2 in place and with the connector placed on a mother board.

FIG. 3 shows an exploded perspective view on a connector 8 together with the ESD protection assembly 14 of FIG. 2. Connector 8 is an USB-connector and has a housing 9, a bottom side 11 to be connected to a motherboard 13 as shown in FIG. 4 and a front side 15 connectable to another not-shown electronic device by USB-connection. Connector 8 is an USB connector according to the respective technical international standard for USB connectors according to the specification of USB 2.0.

The bottom side 11 of connector 8 carries pins 6 to be connected to electrical traces 20 of motherboard 13 as shown in FIG. 4. Moreover the bottom side 11 has legs 22 to be placed in corresponding holes 24 in motherboard 13 as shown in FIG. 4 to fix connector 8 on motherboard 13.

Pins 6 define a footprint of connector 8. As shown in FIG. 3 holes 4 in the carrier-PCB 2 of ESD protection assembly 14 are designed to be adapted to the footprint of connector 8 so that holes 4 can receive the pins 6 of the dedicated connector 8.

FIG. 4 shows a perspective view on the connector 8 of FIG. 3 with the ESD protection assembly 14 of FIG. 2 in place and with the connector 8 placed on the motherboard 13. Since the ESD protection assembly 14 was integrated into the connector 8 according to FIG. 3 before connector 8 was placed on motherboard 13, ESD protection assembly 14 is now caught between motherboard 13 and the housing 9 of connector 8. Accordingly, second IC 12 is placed between the pins 6 of connector 8. Therefore, FIG. 4 shows an electrical connector 8 for a first not-shown IC connected to traces 20 on motherboard 13 of a not-shown electronic device, electrical connector 8 comprising a second IC 12 carrying ESD protection, the second IC 12 being integrated into the connector 8. Motherboard 13 can be part of any electronic device possible.

Figure 5:
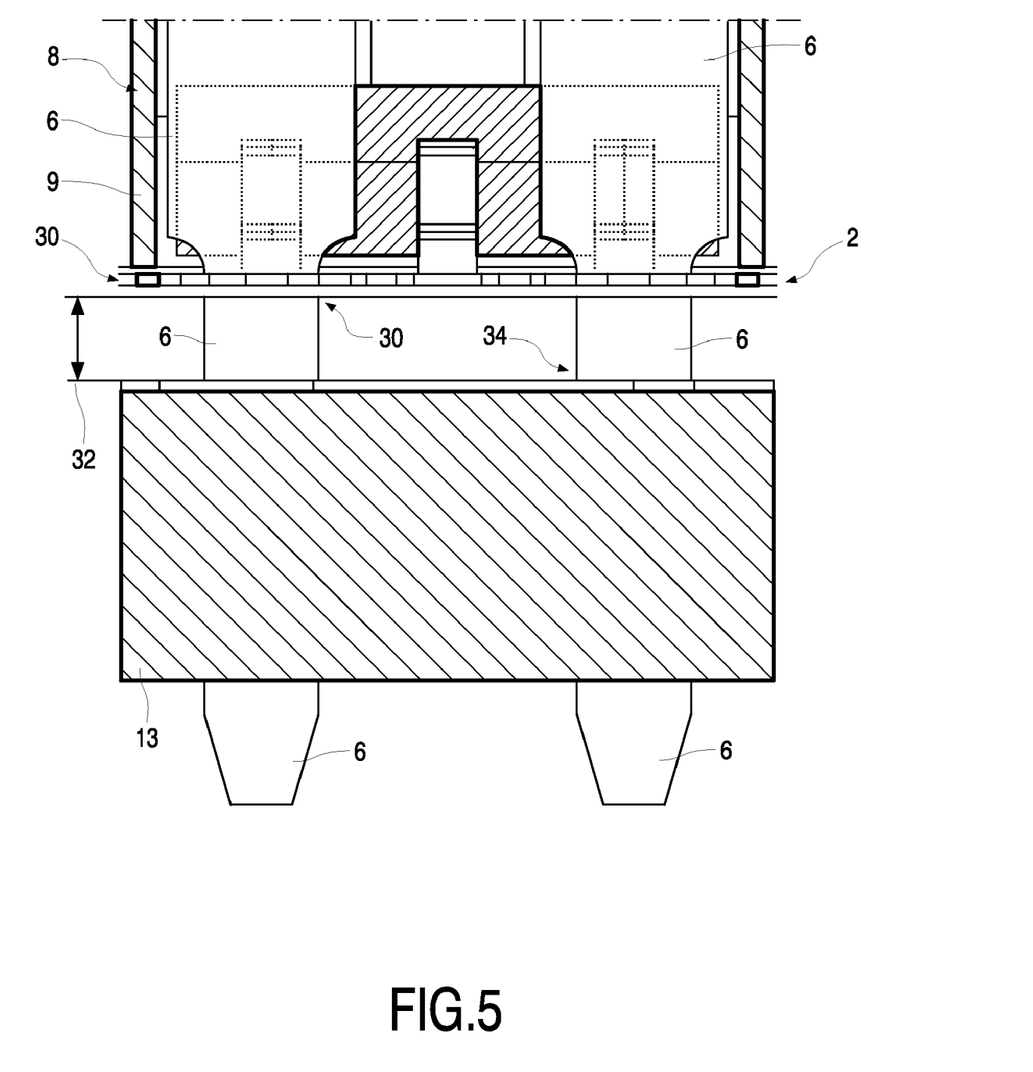
FIG. 5 shows a sectional view of a part of FIG. 4.

FIG. 5 shows a sectional view of a part of FIG. 4. According to FIG. 5 carrier-PCB 2 of the ESD protection assembly 14 is connected to the pins 6 of connector 8 at a first location 30 on pins 6 which first location 30 is spaced by a certain distance 32 from a second location 34 which second location 34 is connected to the motherboard 13 of the not-shown first IC. The distance is about 0.5 mm.

FIG. 6 shows a perspective view on the connector 8 of FIG. 3 with the ESD protection assembly 14 of FIG. 2 in place without the connector 8 being placed on a motherboard 13.

FIG. 7 shows an enlarged view on the encircled part of FIG. 6. FIGS. 6 and 7 show that due to the shortening or trimming of the leads 1, 3, 4, and 6 of the second IC 12 the second IC 12 is suitable to be placed inside the footprint defined by pins 6 of the connector 8.

Figure 8:
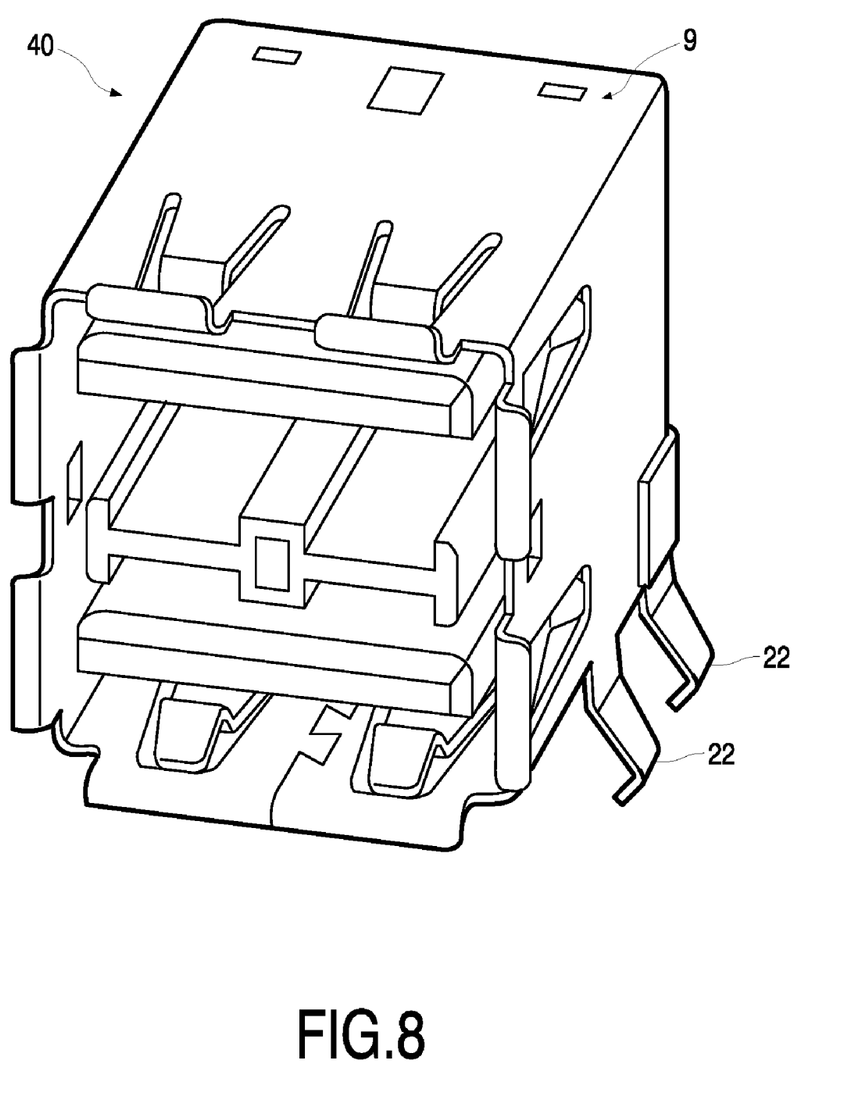
FIG. 8 shows a perspective view on a connector of the prior art.

FIG. 8 shows a perspective view on a connector of the prior art. With respect to the connector 8 of FIG. 3 the view is on the backside 15 of the prior art connector 40. The only difference between prior art connector 40 and connector 8 as shown in FIG. 6, for example, is that connector 8 of FIG. 6 comprises an ESD protection assembly 14. Accordingly, no change of the housing 9 of prior art connector 40 is necessary to implement ISD protection assembly 14 of the present invention.

If FIGS. 1, 2, 3, 6, and 4 are put in a row they show an embodiment of the method for making an electrical connector 8 for a first not-shown IC according to the present invention. The method according to the afore-mentioned Figures of the attached drawings comprises the step of providing ESD protection to a not-shown first IC on a motherboard 13 by integrating a second IC 12 carrying ESD protection into the connector 8 by coupling the second IC 12 between pins 6 of the connector 8 by placing the second IC 12 on a carrier-PCB 2 of FIG. 1 according to FIG. 2 and connecting a carrier-PCB 2 to the pins 6 of the connector 8 according to FIGS. 3 and 6 prior to the step of connecting the connector 8 to the first not-shown IC by putting it into holes of a motherboard 13 connected to the not-shown first IC according to FIG. 4.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A system comprising:
   a circuit board having openings for receiving corresponding pins of an electrical connector, the pins defining a footprint of the electrical connector and comprising at least an input pin and a ground pin;
   an electrostatic discharge protection assembly coupled with the circuit board and positioned within the footprint of the electrical connector such that when the electrical connector is attached to the circuit board, the electrostatic discharge protection assembly is disposed between the circuit board and the electrical connector.

2. The system of claim 1, wherein the electrical connector is coupled with a first integrated circuit.

3. The system of claim 2, wherein the electrostatic discharge protection assembly comprises a second integrated circuit.

4. The system of claim 1, wherein the second integrated circuit is formed having pins with a length of about 0.3 mm.

5. The system of claim 1, wherein the circuit board is connected to the pins at a first location on the pins which first location is spaced by a certain distance from a second location which second location is designated to be connected to a mother board.

6. The system of claim 5, wherein the distance is about 0.1-1.0 mm, preferably about 0.5 mm.

7. The system of claim 1, wherein the electrostatic discharge protection assembly is coupled directly between the input pin and the ground pin.

8. ESD protection assembly for a first IC, comprising:
   a carrier-PCB being connectable to pins of a dedicated connector of the first IC, and a second IC carrying ESD protection, the second IC being located between the carrier-PCB and the dedicated connector, and coupled directly between an input pin and a ground pin of the dedicated connector.

9. ESD protection assembly as claimed in claim 8, wherein the carrier-PCB comprises holes adapted to receive the pins of the dedicated connector.

10. ESD protection assembly as claimed in claim 8, wherein the second IC is assembled in a standard IC package and the standard IC package is connected to the carrier-PCB.

11. ESD protection assembly as claimed in claim 8, wherein the second IC is attached to the carrier-PCB and at least some of connections between the second IC and the carrier-PCB are protected by a protective material enshrouding the second IC and its connections to the carrier-PCB.

12. ESD protection assembly as claimed in claim 8, wherein the assembly is designed to provide at least between 8 and 15 kV ESD protection.

13. ESD protection assembly as claimed in claim 8, wherein the assembly comprises an active silicon based IC.

14. ESD protection assembly as claimed in claim 8, wherein the assembly comprises diodes in a rail-to-rail configuration.

15. ESD protection assembly as claimed in claim 8, wherein the assembly shows a small internal capacitance, preferably in the order of 1 pF.

16. A method for making an electrical connector for a first IC, comprising the step of:
   providing a circuit board having openings for receiving corresponding pins of an electrical connector, the pins defining a footprint of the electrical connector and comprising at least an input pin and a ground pin; and providing an electrostatic discharge protection assembly coupled with the circuit board and positioned within the footprint of the electrical connector such that when the electrical connector is attached to the circuit board, the electrostatic discharge protection assembly is disposed between the circuit board and the electrical connector.

17. Method as claimed in claim 16, wherein the electrostatic discharge protection assembly is coupled directly to the input pin and the ground pin.

18. Method as claimed in claim 16, further comprising coupling the circuit board to the pins of the connector.

19. Method as claimed in claim 16, further comprising the step of:

connecting the circuit board to the electrical connector prior to a step of connecting the electrical connector to a first IC.

* * * * *